(12) United States Patent
Uekura et al.

(10) Patent No.: US 11,979,120 B2
(45) Date of Patent: May 7, 2024

(54) AMPLIFIER CIRCUITRY AND CURRENT SENSOR HAVING THE SAME

(71) Applicant: Alps Alpine Co., Ltd., Tokyo (JP)

(72) Inventors: Takaharu Uekura, Tokyo (JP); Masahiko Ota, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 264 days.

(21) Appl. No.: 17/680,721

(22) Filed: Feb. 25, 2022

(65) Prior Publication Data
US 2022/0278660 A1  Sep. 1, 2022

(30) Foreign Application Priority Data

Mar. 1, 2021 (JP) .................................. 2021-032124

(51) Int. Cl.
*H03F 3/45* (2006.01)
*G01R 19/18* (2006.01)
*H03F 3/387* (2006.01)

(52) U.S. Cl.
CPC .............. *H03F 3/387* (2013.01); *G01R 19/18* (2013.01); *H03F 3/45479* (2013.01); *H03F 2200/171* (2013.01)

(58) Field of Classification Search
CPC .................. H03F 3/387; H03F 3/45479; H03F 2200/171; H03F 3/393; H03F 2200/129; H03F 2200/135; H03F 2200/156; H03F 2200/264; H03F 3/005; H03F 3/45475; H03F 3/45959; H03F 3/45986; H03F 1/301; G01R 19/18
USPC ...................................... 330/295, 9, 253, 254
See application file for complete search history.

(56) References Cited

U.S. PATENT DOCUMENTS 7,535,295 B1 * 5/2009 Huijsing ................... H03F 1/26
327/124
2016/0187385 A1   6/2016 Ota

* cited by examiner

*Primary Examiner* — Andrea Lindgren Baltzell
*Assistant Examiner* — Khiem D Nguyen
(74) *Attorney, Agent, or Firm* — Crowell & Moring LLP

(57) ABSTRACT

Amplifying circuitry configured such that when a detection circuit detects an abnormal state in which the level of signals input to a main amplifying circuit exceeds a normal range, a control circuit sets the state of integration of signals in the integration circuit to a default state. When the detection circuit detects the abnormal state and then detects that an operating state returns to a normal state in which the level of signals input to the main amplifying circuit is included in the normal range, the control circuit cancels the setting of the default state in the integration circuit.

11 Claims, 9 Drawing Sheets

AMPLIFIER CIRCUITRY AND CURRENT SENSOR HAVING THE SAME

CLAIM OF PRIORITY

This application claims the benefit of priority to Japanese Patent Application No. 2021-032124 filed on Mar. 1, 2021, the entire content of which is hereby incorporated by reference.

BACKGROUND

1. Field of the Disclosure

The present disclosure relates to amplifier circuitry that uses a chopper amplifier circuit to reduce drift of an input offset voltage and a current sensor using the amplifier circuitry.

2. Description of the Related Art

Chopper amplifier circuits are widely used for high-accuracy direct-current amplifier circuits that reduce drift of input offset voltages. Typical chopper amplifier circuits each include a switch circuit that modulates an input signal with a certain frequency, an amplifier that amplifies the modulated signal, and a switch circuit that demodulates the modulated signal amplified by the amplifier. In general, a filter circuit for removing high-frequency components included in the demodulated signal is provided at a stage subsequent to the chopper amplifier circuit. When the input signal is directly amplified, drift components of an input offset voltage is also amplified together, and thus a large amount of error due to the drift components occurs in an output signal. Each chopper amplifier circuit converts the input signal into a modulated signal having a sufficiently higher frequency than the band of the drift components, amplifies the modulated signal, and demodulates the amplified signal to return the signal into a signal in an original frequency band. Thus, it is possible to significantly reduce the amount of error due to the drift components.

In high-accuracy and wideband operational amplifiers, the chopper amplifier circuits may be used for offset correction circuits for correcting input offset voltages. The chopper amplifier circuits are mainly used to amplify input voltages that are close to direct current, and other high-speed amplifiers are used to amplify signals having high frequencies. A response speed of each offset correction circuit including the chopper amplifier circuit has almost no influence on frequency characteristics of the entire circuitry in a normal operating state.

However, there are cases in which when an excessive signal is input, and an output reaches its maximum level, the operating state enters a saturation state in which a direct-current potential in the circuitry diverges significantly from the normal state. When the operating state returns from the saturation state to the normal state, the response speed of the offset correction circuit becomes problematic. That is, since negative feedback control does not work in the saturation state, and the offset correction circuit temporarily operates singularly, the entire circuitry cannot return to the normal state until the offset correction circuit singularly returns to the normal state. In the offset correction circuit, in particular, the response speed of a filter circuit provided at a stage subsequent to the chopper amplifier circuit is low, which delays the time for recovery to the normal state.

Accordingly, in the amplifier circuitry disclosed in U.S. Patent No. 2016/0187385A1, when the circuitry enters a saturation state owing to inputting of an excessive signal or the like, a sample and hold circuit included in a filter circuit at a stage subsequent to a chopper amplifier circuit is controlled so that a signal holding operation of the sample and hold circuit is stopped, and a signal input from a previous stage is directly output to the subsequent stage. As a result, the amount of delay of a response in the sample and hold circuit decreases, and thus the time for recovery to the normal state can be reduced.

Meanwhile, in the amplifier circuitry disclosed in U.S. Patent No. 2016/0187385A1, the filter circuit at the stage subsequent to the chopper amplifier circuit includes an integration circuit (a low-pass filter), and when an excessive signal is input, an amplifier that is included in the integration circuit also enters a saturation state. Since the integration circuit has a large time constant, the time taken from the saturation state to the normal state is relatively long. However, since the saturation state of the integration circuit cannot be quickly cleared with the control on the above-described sample and hold circuit, it is not possible to reduce the delay of recovery to the normal state, the delay being caused by the time constant of the integration circuit.

SUMMARY

The present invention provides amplifier circuitry that can reduce drift of an input offset voltage by using a chopper amplifier circuit and that can reduce the time for recovery from a state in which negative feedback control does not work properly owing to influences of excessive input signals or the like to the normal state and is to provide a current sensor having such amplifier circuitry.

Amplifier circuitry according to a first aspect includes: a main amplifying circuit in which an output is negatively fed back to an input; an offset correction circuit that corrects an input offset voltage of the main amplifying circuit; a detection circuit that detects an abnormal state in which a level of signals input to the main amplifying circuit exceeds a normal range; and a control circuit that controls the offset correction circuit. In the main amplifying circuit, the input offset voltage is corrected in accordance with correction signals supplied from the offset correction circuit. The offset correction circuit includes: a chopper amplifier circuit that amplifies an input voltage of the main amplifying circuit; a filter circuit that removes a high-frequency component included in output signals of the chopper amplifier circuit; and a correction-signal supply circuit that supplies the correction signals corresponding to output signals of the filter circuit to the main amplifying circuit. The filter circuit includes an integration circuit provided on a signal path between the chopper amplifier circuit and the correction-signal supply circuit. The control circuit sets a state of integration of signals in the integration circuit to a default state, when the detection circuit detects the abnormal state, and cancels the setting of the default state in the integration circuit, when the detection circuit detects the abnormal state and then detects that an operating state returns to a normal state in which the level of signals input to the main amplifying circuit is included in the normal range.

According to the above-described configuration, when the abnormal state in which the level of signals input to the main amplifying circuit exceeds the normal range is detected, the state of the integration of the signals in the integration circuit is set to the default state. Thereafter, when it is detected that the operating state returns to the normal state in which the level of signals input to the main amplifying circuit is included in the normal range, the setting of the default state in the integration circuit is canceled. At this point in time, the integration of the signals in the integration circuit is resumed from the default state to thereby facilitate that the integration circuit starts an integration operation in a state close to a case in which the negative feedback control is working properly. This facilitates that the correction signals output from the correction-signal supply circuit in response to the output signals of the filter circuit return to an appropriate level quickly, thus facilitating that the negative feedback control returns to the normal state quickly.

DESCRIPTION OF THE EXEMPLARY EMBODIMENTS

Figure 1:
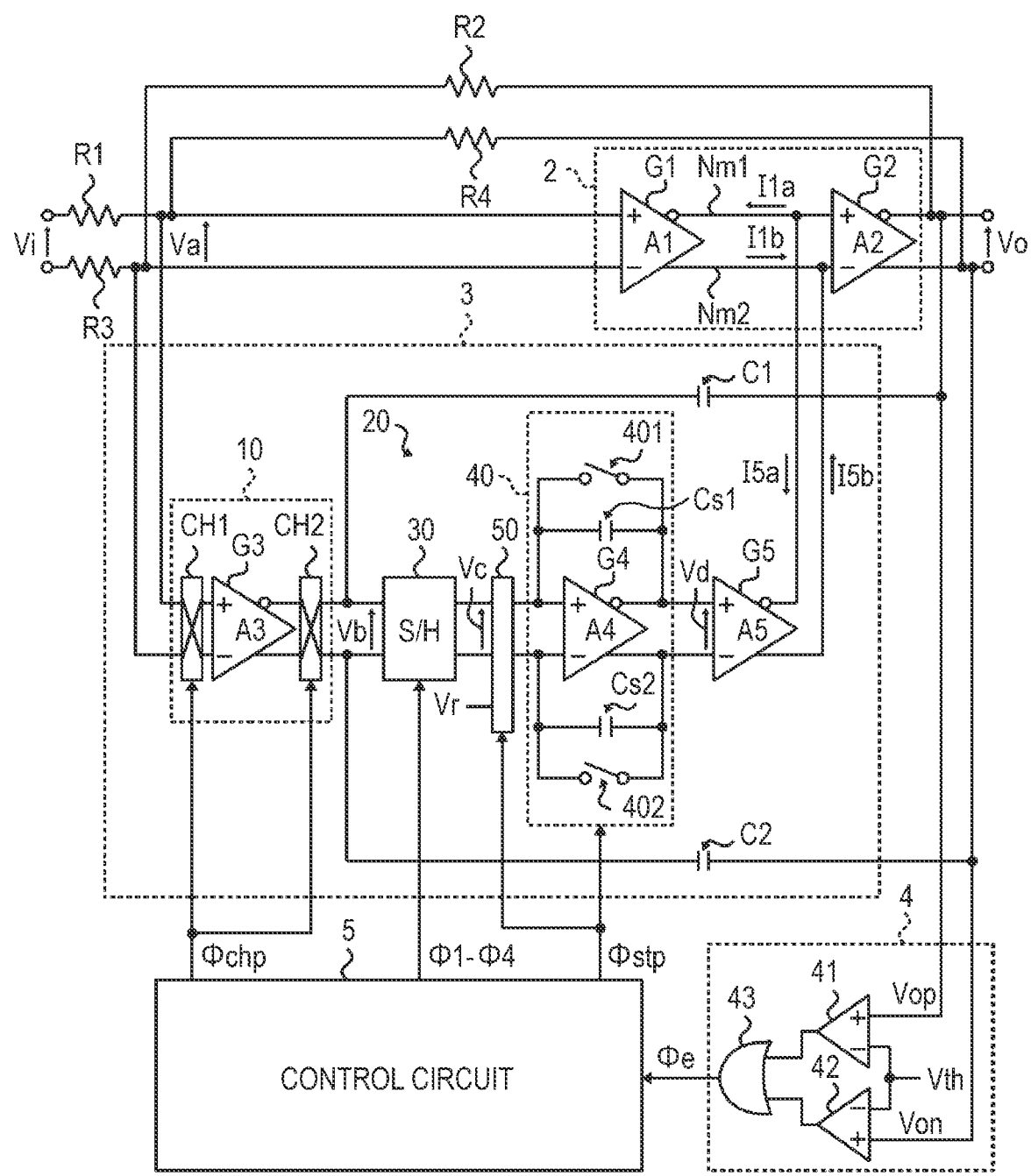
FIG. 1 is a diagram illustrating one example of a configuration of amplifier circuitry according to an embodiment.

FIG. 1 is a diagram illustrating one example of a configuration of amplifier circuitry according to a first embodiment.

Amplifier circuitry 1 illustrated in FIG. 1 includes a main amplifying circuit 2 that amplifies input signals, an offset correction circuit 3 that corrects an input offset voltage of the main amplifying circuit 2, a detection circuit 4, and a control circuit 5.

The main amplifying circuit 2 includes two amplifying stages G1 and G2 that are connected in cascade. The amplifying stage G1 amplifies an input voltage Va, and the amplifying stage G2 further amplifies output signals of the amplifying stage G1. In the example illustrated in FIG. 1, each of the amplifying stages G1 and G2 has two differential input terminals (an inverting input terminal and a non-inverting input terminal) and two differential output terminals (an inverting output terminal and a non-inverting output terminal). The inverting output terminal of the amplifying stage G1 is connected to the non-inverting input terminal of the amplifying stage G2, and the non-inverting output terminal of the amplifying stage G1 is connected to the inverting input terminal of the amplifying stage G2. For example, the amplifying stage G1 outputs current differential signals (I1a and I1b) corresponding to input-voltage differential signals (the input voltage Va). The amplifying stage G2 outputs voltage differential signals (an output voltage Vo) corresponding to the input current differential signals (I1a and I1b).

Outputs of the main amplifying circuit 2 are negatively fed back to an input thereof via a feedback circuit including resistors R1 to R4. The resistor R2 is provided on a path between the inverting output terminal of the amplifying stage G2 and the inverting input terminal of the amplifying stage G1, and the resistor R4 is provided on a path between the non-inverting output terminal of the amplifying stage G2 and the non-inverting input terminal of the amplifying stage G1. The resistor R1 is provided on a path between the non-inverting input terminal of the amplifying stage G1 and one input terminal of an input voltage V1, and the resistor R3 is provided on a path between the inverting input terminal of the amplifying stage G1 and another input terminal of the input voltage Vi. When the resistance value of the resistors R1 and R3 is represented by "Rb", and the resistance value of the resistors R2 and R4 is represented by "Rf", a voltage amplification factor is generally "Rf/Rb".

The offset correction circuit 3 amplifies the input voltage Va of a first stage (the amplifying stage G1) in the main amplifying circuit 2, the input voltage Va being brought close to a zero voltage owing to an effect of the negative feedback, and supplies signals resulting from the amplification to intermediate nodes (nodes Nm1 and Nm2 via which differential outputs of the amplifying stage G1 and differential inputs of the amplifying stage G2 are connected in cascade) in the main amplifying circuit 2 as correction signals. For example, the offset correction circuit 3 outputs current differential signals (I5a and I5b) to the nodes Nm1 and Nm2 as correction signals. Current differential signals (I1a+I5a and I1b+I5b) combined at the nodes Nm1 and Nm2 are input to the amplifying stage G2.

The correction signals of the offset correction circuit 3 are negatively fed back to the input of the main amplifying circuit 2 (the input of the amplifying stage G1) via the amplifying stage G2 in the main amplifying circuit 2 and the feedback circuit (the resistors R1 to R4). When the input voltage Va of the main amplifying circuit 2 increases in a positive direction, the negative feedback works so that the increase in the input voltage Va in the positive direction is reduced, and conversely, when the input voltage Va increases in a negative direction, the negative feedback works so that the increase in the input voltage Va in the negative direction is reduced.

In the example illustrated in FIG. 1, the offset correction circuit 3 includes a chopper amplifier circuit 10 that amplifies the input voltage Va of the main amplifying circuit 2, a filter circuit 20 that removes high-frequency components included in output signals of the chopper amplifier circuit 10, and a correction-signal supply circuit G5 that supplies correction signals corresponding to output signals of the filter circuit 20 to the main amplifying circuit 2.

The chopper amplifier circuit 10 amplifies the input voltage Va of the main amplifying circuit 2 by performing a chopper operation. The chopper amplifier circuit 10 includes, for example, a chopper modulator CH1, a chopper amplifying stage G3, and a chopper demodulator CH2, as illustrated in FIG. 1.

The chopper modulator CH1 modulates the input voltage Va in accordance with a control signal Φchp that is synchronous with a clock signal CLK. For example, the chopper modulator CH1 is implemented using a switch circuit that reverses the polarity of the input voltage Va, which corresponds to the differential signals.

The chopper amplifying stage G3 is a circuit for amplifying modulated signals of the input voltage Va, the modulated signals being modulated by the chopper modulator CH1. In the example illustrated in FIG. 1, input signals of the chopper amplifying stage G3 are differential signals, and output signals of the chopper amplifying stage G3 are differential signals. For example, the chopper amplifying stage G3 may output current differential signals corresponding to the input-voltage differential signals.

The chopper demodulator CH2 demodulates the modulated signals, amplified by the chopper amplifying stage G3, in accordance with the control signal Φchp. For example, the chopper demodulator CH2 is implemented using a switch circuit that reverses the polarities of the differential signals output from the chopper amplifying stage G3.

In the example illustrated in FIG. 1, the filter circuit 20 includes a sample and hold circuit 30, an integration circuit 40, and a common-mode switch circuit 50.

The sample and hold circuit 30 and the integration circuit 40 are provided on a signal path between the chopper amplifier circuit 10 and the correction-signal supply circuit G5. In the example illustrated in FIG. 1, the sample and hold circuit 30 is provided at a stage subsequent to the chopper amplifier circuit 10, the integration circuit 40 is provided at a stage subsequent to the sample and hold circuit 30, and the correction-signal supply circuit G5 is provided at a stage subsequent to the integration circuit 40. The common-mode switch circuit 50 is provided at an input of the integration circuit 40.

The sample and hold circuit 30 is a circuit for removing ripple included in outputs of the chopper amplifier circuit 10 and operates as a notch filter for attenuating frequency components of the control signal Φchp that is synchronous with the clock signal CLK. In synchronization with a chopper operation of the chopper amplifier circuit 10, the sample and hold circuit 30 holds signals, output from the chopper amplifier circuit 10 at the previous stage, in sample and hold capacitors Cd1 to Cd4 (FIG. 2) and also outputs the signals, held in the ample and hold capacitors Cd1 to Cd4, to the integration circuit 40 at the subsequent stage.

Figure 2:
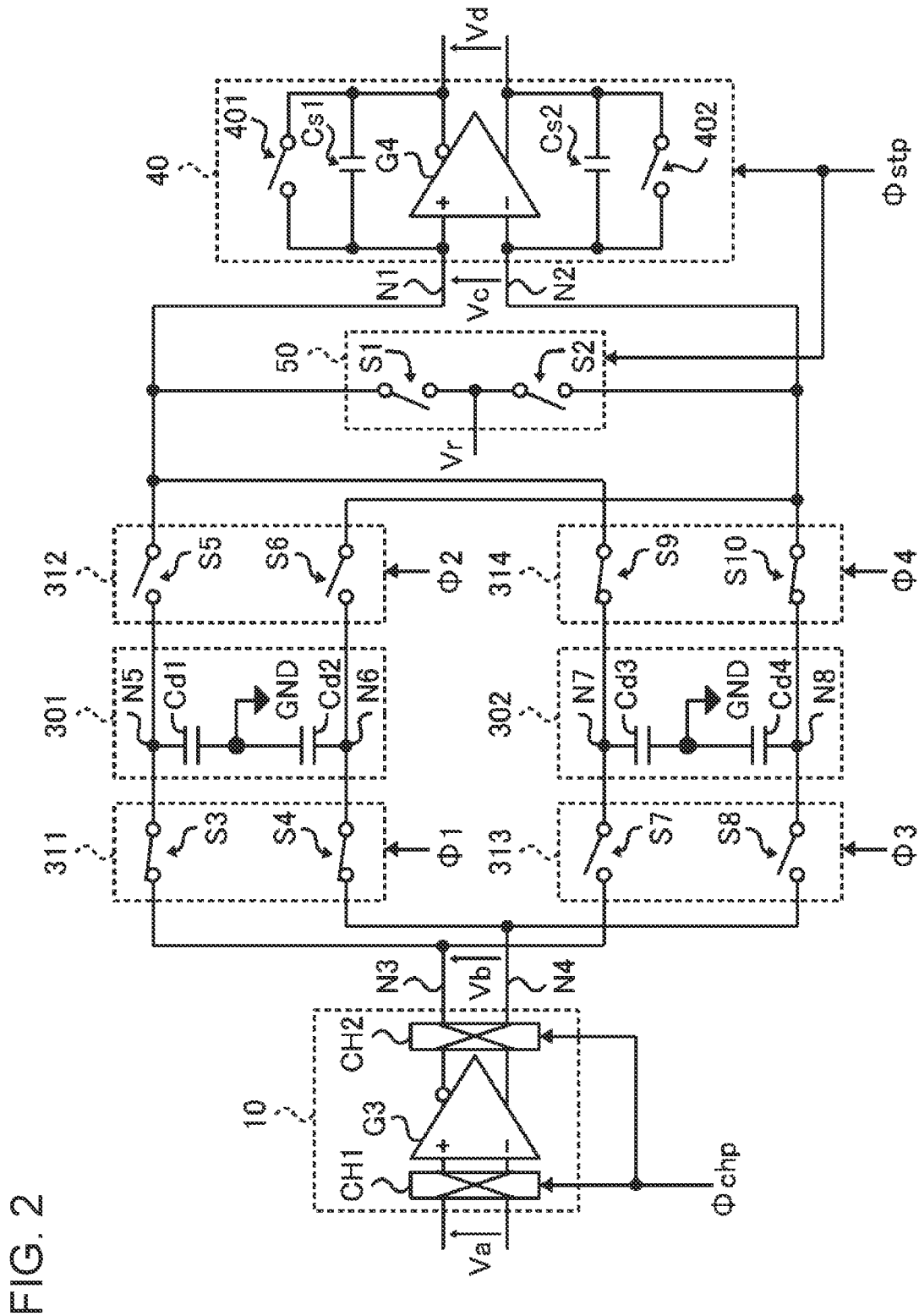
FIG. 2 is a diagram illustrating one example of a configuration of a major portion in an offset correction circuit.

The sample and hold circuit 30 includes, for example, a first capacitor circuit 301, a second capacitor circuit 302, a first switch circuit 311, a second switch circuit 312, a third switch circuit 313, and a fourth switch circuit 314, as illustrated in FIG. 2.

The first capacitor circuit 301 includes two sample and hold capacitors Cd1 and Cd2 connected in series between a pair of nodes N5 and N6. An intermediate connection node of the two sample and hold capacitors Cd1 and Cd2 is connected to a reference potential GND.

The second capacitor circuit 302 includes two sample and hold capacitors Cd3 and Cd4 connected in series between a pair of nodes N7 and N8. An intermediate connection node of the two sample and hold capacitors Cd3 and Cd4 is connected to the reference potential GND.

The first switch circuit 311 is provided on a path that connects the pair of nodes N5 and N6 in the first capacitor circuit 301 and a pair of output nodes N3 and N4 of the chopper amplifier circuit 10. In the example in FIG. 2, the first switch circuit 311 includes a switch S3 provided on a path between the nodes N5 and N3 and a switch S4 provided on a path between the nodes N6 and N4.

The second switch circuit 312 is provided on a path that connects the pair of nodes N5 and N6 in the first capacitor circuit 301 and a pair of input nodes N1 and N2 of the integration circuit 40. In the example in FIG. 2, the second switch circuit 312 includes a switch S5 provided on a path between the nodes N5 and N1 and a switch S6 provided on a path between the nodes N6 and N2.

The third switch circuit 313 is provided on a path that connects a pair of nodes N7 and N8 in the second capacitor circuit 302 and the pair of output nodes N3 and N4 of the chopper amplifier circuit 10. In the example in FIG. 2, the third switch circuit 313 includes a switch S7 provided on a path between the nodes N7 and N3 and a switch S8 provided on a path between the nodes N8 and N4.

The fourth switch circuit 314 is provided on a path that connects the pair of nodes N7 and N8 in the second capacitor circuit 302 and the pair of input nodes N1 and N2 of the integration circuit 40. In the example in FIG. 2, the fourth switch circuit 314 includes a switch S9 provided on a path between the nodes N7 and N1 and a switch S10 provided on a path between the nodes N8 and N2.

The first switch circuit 311 is turned on or off in response to a control signal Φ1, the second switch circuit 312 is turned on or off in response to a control signal Φ2, the third switch circuit 313 is turned on or off in response to a control signal Φ3, and the fourth switch circuit 314 is turned on or off in response to a control signal Φ4.

The integration circuit 40 integrates signals output from the sample and hold circuit 30 at the previous stage and outputs the integrated signal to the correction-signal supply circuit G5 at the subsequent stage. The integration circuit 40 removes high-frequency components (particularly, drift components of the input voltage Va which become harmonics through a chopper operation of the chopper demodulator CH2) included in the outputs of the sample and hold circuit 30. The integration circuit 40 includes, for example, an integration amplifying stage G4 provided on a signal path between the sample and hold circuit 30 and the correction-signal supply circuit G5, integration capacitors Cs1 and Cs2 provided on negative feedback paths between inputs and outputs of the integration amplifying stage G4, and discharging circuits 401 and 402 that discharge charges accumulated in the integration capacitors Cs1 and Cs2, as illustrated in FIG. 1.

In the example in FIG. 1, input signals of the integration amplifying stage G4 are differential signals, and output signals of the integration amplifying stage G4 are differential signals. A non-inverting input terminal of the integration amplifying stage G4 is connected to the output node N3 of the chopper amplifier circuit 10 via the sample and hold circuit 30, and an inverting input terminal of the integration amplifying stage G4 is connected to the output node N4 of the chopper amplifier circuit 10 via the sample and hold circuit 30. For example, the integration amplifying stage G4 may output current differential signals corresponding to input-voltage differential signals.

The integration capacitor Cs1 is provided on a path between an inverting output terminal and the non-inverting input terminal of the integration amplifying stage G4. The integration capacitor Cs2 is provided on a path between a non-inverting output terminal and the inverting input terminal of the integration amplifying stage G4. In the example in FIG. 1, the discharging circuit 401 is a switch connected in parallel with the integration capacitor Cs1, and the discharging circuit 402 is a switch connected in parallel with the integration capacitor Cs2. The discharging circuits 401 and 402 are turned on or off in response to a control signal Φstp.

The common-mode switch circuit 50 is provided on a path that connects the pair of input nodes N1 and N2 of the integration circuit 40 and a common mode reference voltage Vr and is turned on or off in response to the control signal Φstp. In the example in FIG. 2, the common-mode switch circuit 50 includes a switch S1 provided on a path between the node N1 and the common mode reference voltage Vr and a switch S2 provided on a path between the node N2 and the common mode reference voltage Vr. The common mode reference voltage Vr is set to, for example, one-half of a power-supply voltage.

A reference is made to FIG. 1 again.

The correction-signal supply circuit G5 supplies the correction signals (I5a and I5b) corresponding to output signals (a voltage Vc) of the integration circuit 40 at the previous stage to the intermediate nodes Nm1 and Nm2 via which the amplifying stage G1 and the amplifying stage G2 are connected in cascade. The correction-signal supply circuit G5 is an amplifier circuit for outputting the current differential signals (I5a and I5b) corresponding to the input-voltage differential signals (the voltage Vc). In the example in FIG. 1, a non-inverting input terminal of the correction-signal supply circuit G5 is connected to the inverting output terminal of the integration amplifying stage G4, and an inverting input terminal of the correction-signal supply circuit G5 is connected to the non-inverting output terminal of the integration amplifying stage G4. The inverting output terminal of the correction-signal supply circuit G5 is connected to the node Nm1, which is connected to the inverting output terminal of the amplifying stage G1 and the non-inverting input terminal of the amplifying stage G2, and a non-inverting output terminal of the correction-signal supply circuit G5 is connected to the node Nm2, which is connected to the non-inverting output terminal of the amplifying stage G1 and the inverting input terminal of the amplifying stage G2.

The detection circuit 4 detects an abnormal state in which the level of signals input to the main amplifying circuit 2 exceeds a normal range. That is, the detection circuit 4 detects that a bias voltage or the like in each circuit enters an abnormal state owing to application of an excessive input voltage V1, and the negative feedback control does not work properly. In the example in FIG. 1, the detection circuit 4 detects the abnormal state, based on the output voltage Vo of the main amplifying circuit 2. That is, the detection circuit 4 compares each of a positive-side voltage Vop and a negative-side voltage Von of the output voltage Vo, which corresponds to the differential signals, with a threshold Vth, and when one of the positive-side voltage Vop and the negative-side voltage Von becomes higher than the threshold Vth, the detection circuit 4 detects that the abnormal state has occurred. The threshold Vth is set to, for example, a value larger than the upper-limit value of a voltage (e.g., about 90% of the power-supply voltage) with which a linear operation is guaranteed in the main amplifying circuit 2.

The detection circuit 4 illustrated in FIG. 1 includes comparators 41 and 42 and an OR circuit 43. The comparator 41 outputs high-level signals when the voltage Vop exceeds the threshold Vth, and the comparator 42 outputs high-level signals when the voltage Von exceeds the threshold Vth. When one of the comparators 41 and 42 outputs high-level signals, the OR circuit 43 outputs a high-level detection signal Φe indicating that the abnormal state has occurred.

The control circuit 5 is a circuit for controlling the offset correction circuit 3 and generates the control signals Φchp, Φ1 to Φ4, and Φstp described above.

In a normal operation, by alternately switching between the first capacitor circuit 301 and the second capacitor circuit 302 in the sample and hold circuit 30 every cycle of the chopper operation of the chopper amplifier circuit 10, the control circuit 5 connects one of the first capacitor circuit 301 and the second capacitor circuit 302 to an output of the previous stage (the chopper amplifier circuit 10) and connects the other capacitor circuit (the first capacitor circuit 301 or the second capacitor circuit 302), disconnected from the output of the previous stage (the chopper amplifier circuit 10), to an input of the subsequent stage (the integration circuit 40). That is, for causing the sample and hold circuit 30 to perform signal holding that is synchronous with the chopper operation, the control circuit 5 alternately switches between a "first switch state" and a "second switch state" every cycle of the hopper operation (every cycle of the clock signal CLK). In the "first switch state", the first switch circuit 311 and the fourth switch circuit 314 are turned on, and the second switch circuit 312 and the third switch circuit 313 are turned off, and in the "second switch state", the first switch circuit 311 and the fourth switch circuit 314 are turned off, and the second switch circuit 312 and the third switch circuit 313 are turned on. In the example in FIG. 3, the sample and hold circuit 30 is in the "first switch state".

In this case, the control circuit 5 offsets, by a certain phase, the timing of switching between the "first switch state" and the "second switch state" and the timing at which a signal level is switched in the chopper amplifier circuit 10. For example, the control circuit 5 switches between the "first switch state" and the "second switch state" at an intermediate point in time between a timing at which the signal level switches in the chopper amplifier circuit 10 and a next timing at which the signal level switches in the chopper amplifier circuit 10 after that timing.

Meanwhile, when the detection circuit 4 detects the abnormal state, the control circuit 5 sets the state of integration of signals in the integration circuit 40 to a default state. For example, the control circuit 5 causes the discharging circuits 401 and 402 to discharge charges accumulated in the integration capacitors Cs1 and Cs2 in the integration circuit 40.

For setting the state of the integration of the signals in the integration circuit 40 to the default state (i.e., for discharging by the discharging circuits 401 and 402), the control circuit 5 stops the signal holding that is performed by the sample and hold circuit 30 and that is synchronous with the chopper operation, and also sets the levels of the signals held in the sample and hold capacitors Cd1 to Cd4 to a default level.

Specifically, the control circuit 5 turns off each of the first switch circuit 311 and the third switch circuit 313 and also turns on each of the second switch circuit 312 and the fourth switch circuit 314. Also, the control circuit 5 turns on the common-mode switch circuit 50 to connect each of the input nodes N1 and N2 of the integration circuit 40 to the common mode reference voltage Vr.

As a result, the common mode reference voltage Vr (the voltage at the default level) is applied to each of the sample and hold capacitors Cd1 to Cd4 via the common-mode switch circuit 50. Also, paths through which the signals are input to the sample and hold capacitors Cd1 to Cd4 from the stage (the chopper amplifier circuit 10) previous to the sample and hold circuit 30 are disconnected by the first switch circuit 311 and the third switch circuit 313.

In addition, in this case, the control circuit 5 stops the chopper operation of the chopper amplifier circuit 10. That is, the control circuit 5 stops periodic changes in the control signal Φchp that is synchronous with the clock signal CLK. When the chopper operation is stopped, generation of noise is suppressed in the chopper amplifier circuit 10.

When the detection circuit 4 detects the abnormal state and then detects that the operating state has returned to the normal state in which the level of signals input to the main amplifying circuit 2 is included in the normal range, the control circuit 5 cancels the setting of the default state in the integration circuit 40 (i.e., stops the discharging by the discharging circuits 401 and 402). For example, when the detection circuit 4 detects the abnormal state and then detects that the operating state has returned to the normal state, the control circuit 5 cancels the setting of the default state in the integration circuit 40 (stops the discharging by the discharging circuits 401 and 402) after a delay time elapses from when the detection circuit 4 detects that the operating state has returned to the normal state. This delay time is set to, for example, a time that is expected for the detection circuit 4 to reliably detect that the operating state has returned to the normal state.

For canceling the setting (the discharging by the discharging circuits 401 and 402) of the default state in the integration circuit 40, the control circuit 5 cancels the setting of the default level in the sample and hold capacitors Cd1 to Cd4 (stops the application of the common mode reference voltage Vr to the sample and hold capacitors Cd1 to Cd4) and also resumes the signal holding that is performed by the sample and hold circuit 30 and that is synchronous with the chopper operation (i.e., resumes the operation for alternately switching between the "first switch state" and the "second switch state"). In this case, the control circuit 5 turns off the common-mode switch circuit 50 to disconnect each of the input nodes N1 and N2 of the integration circuit 40 from the common mode reference voltage Vr. Also, the control circuit 5 resumes the chopper operation of the chopper amplifier circuit 10 which has been stopped.

Figure 3:
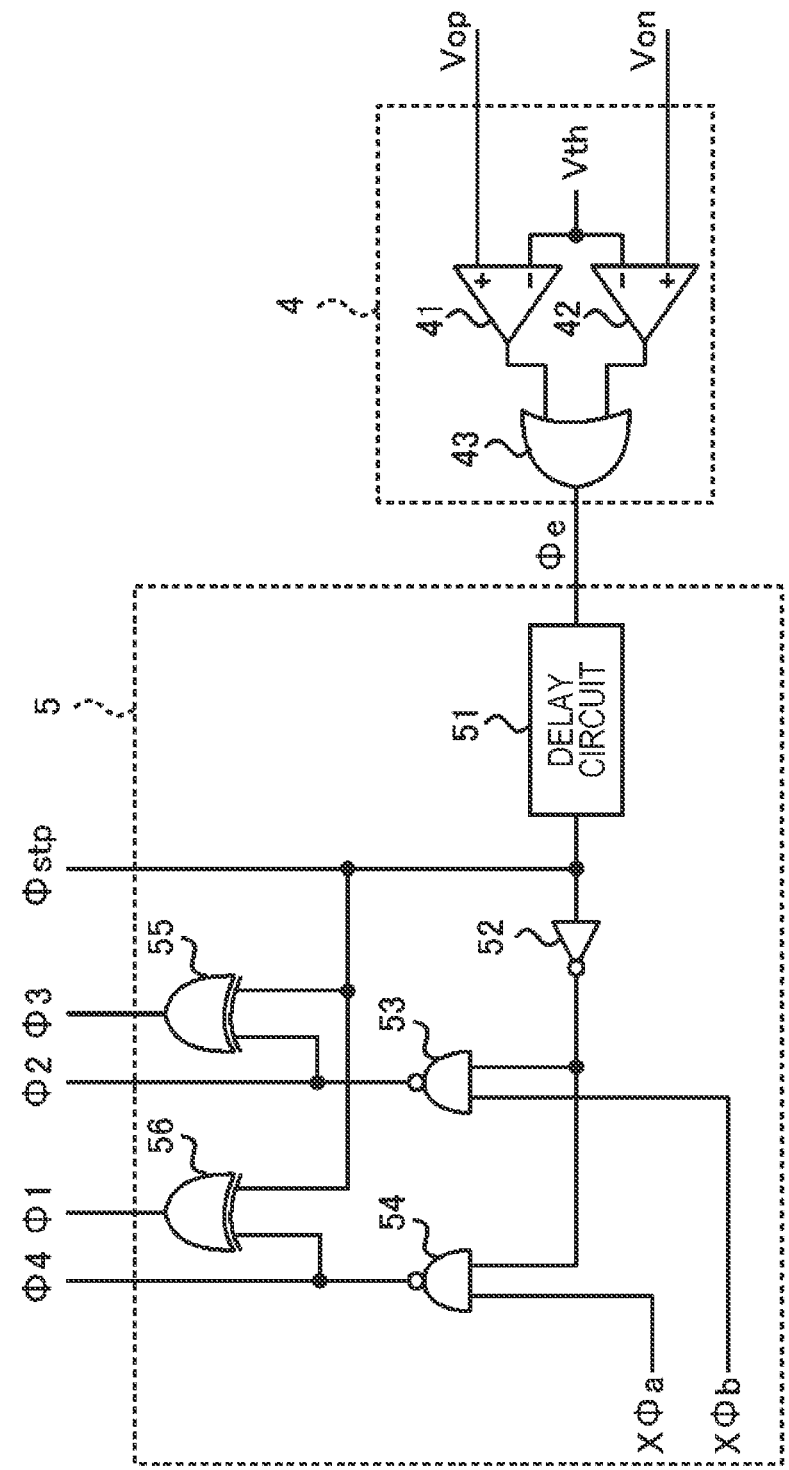
FIG. 3 is a diagram illustrating one example of a configuration of a major portion in a control circuit.

FIG. 3 is a diagram illustrating one example of a configuration of a portion that is included in the control circuit 5 and that generates the control signals Φ1 to Φ4 and Φstp. The control circuit 5 includes, for example, a delay circuit 51, a NOT circuit 52, NAND circuits 53 and 54, and XOR circuits 55 and 56, as illustrated in FIG. 3.

The delay circuit 51 delays a detection signal Φe output from the detection circuit 4 and outputs the resulting signal as the control signal Φstp. The NOT circuit 52 inverts the logic of the control signal Φstp and outputs the resulting control signal to the NAND circuits 53 and 54. The NAND circuit 53 outputs a NAND of the output of the NOT circuit 52 and a control signal XΦb as the control signal Φ2. The NAND circuit 54 outputs a NAND of the output of the NOT circuit 52 and a control signal XΦa as the control signal Φ4. The XOR circuit 55 outputs an XOR of the control signal Φ2 and the control signal Φstp as the control signal Φ3. The XOR circuit 56 outputs an XOR of the control signal Φ4 and the control signal Φstp as the control signal Φ1. Each of the control signals XΦa and XΦb is a signal having a high level and low level that are switched therebetween every cycle of the clock signal CLK. When one of the control signals XΦa and XΦb is at the high level, the other control signal XΦa or XΦb is at the low level.

In a normal state in which the detection signal Φe reaches the low level, the control signal Φstp reaches the low level, and the output signal of the NOT circuit 52 reaches the high level. In this case, the control signals 431 and 434 are equal to signals obtained by inverting the logic of the control signal XΦa, and the control signals Φ2 and Φ3 are equal to signals obtained by inverting the logic of the control signal XΦb.

Meanwhile, in the case of an abnormal state in which the detection signal Φe reaches the high level, the control signal Φstp reaches the high level, and the output signal of the NOT circuit 52 reaches the low level. In this case, the control signals Φ2 and Φ4 become constant at the high levels thereof, and the control signals Φ1 and Φ3 become constant at the low levels thereof.

Figure 4:
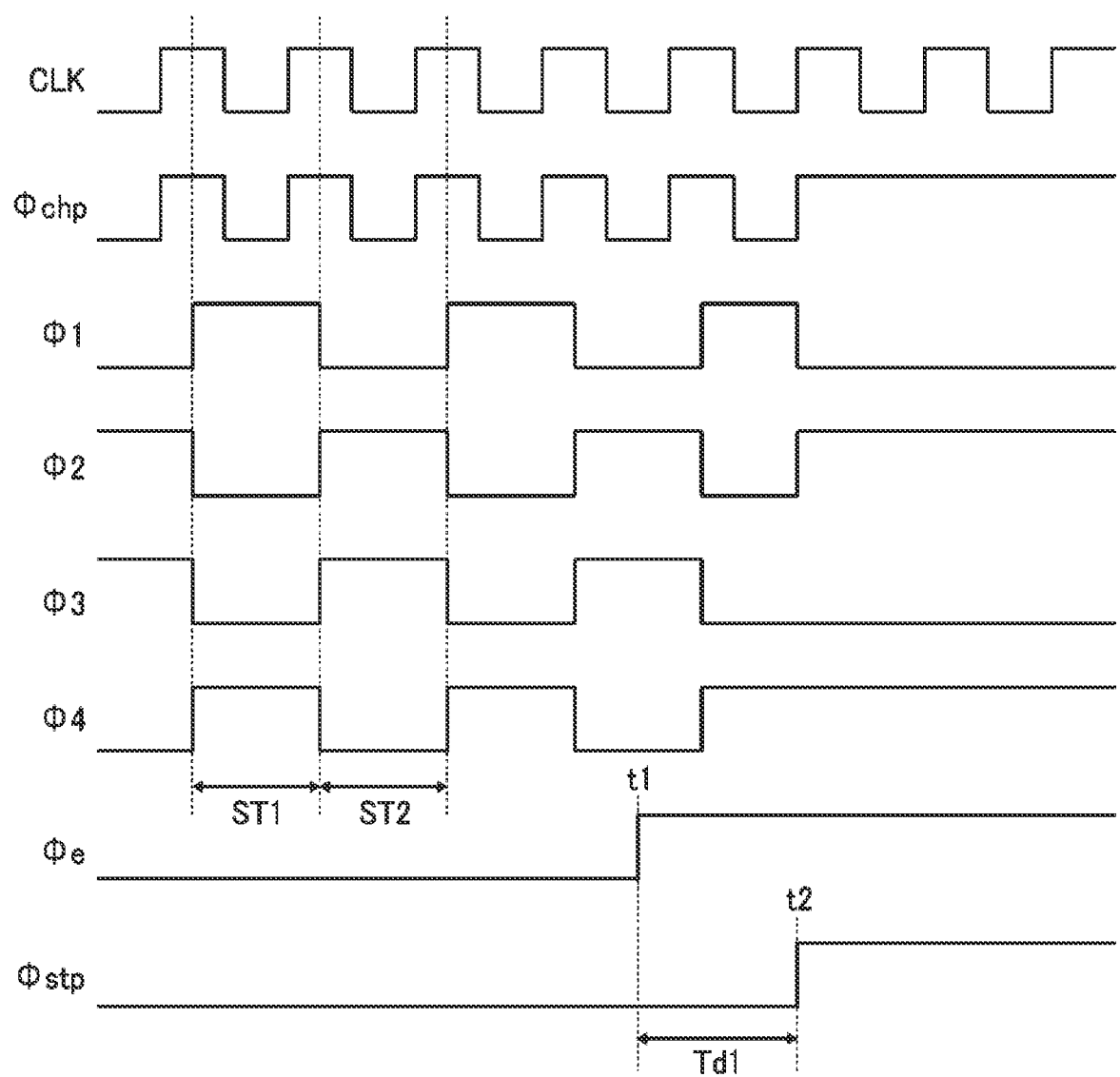
FIG. 4 is a diagram illustrating timings of respective control signals.
Figure 5:
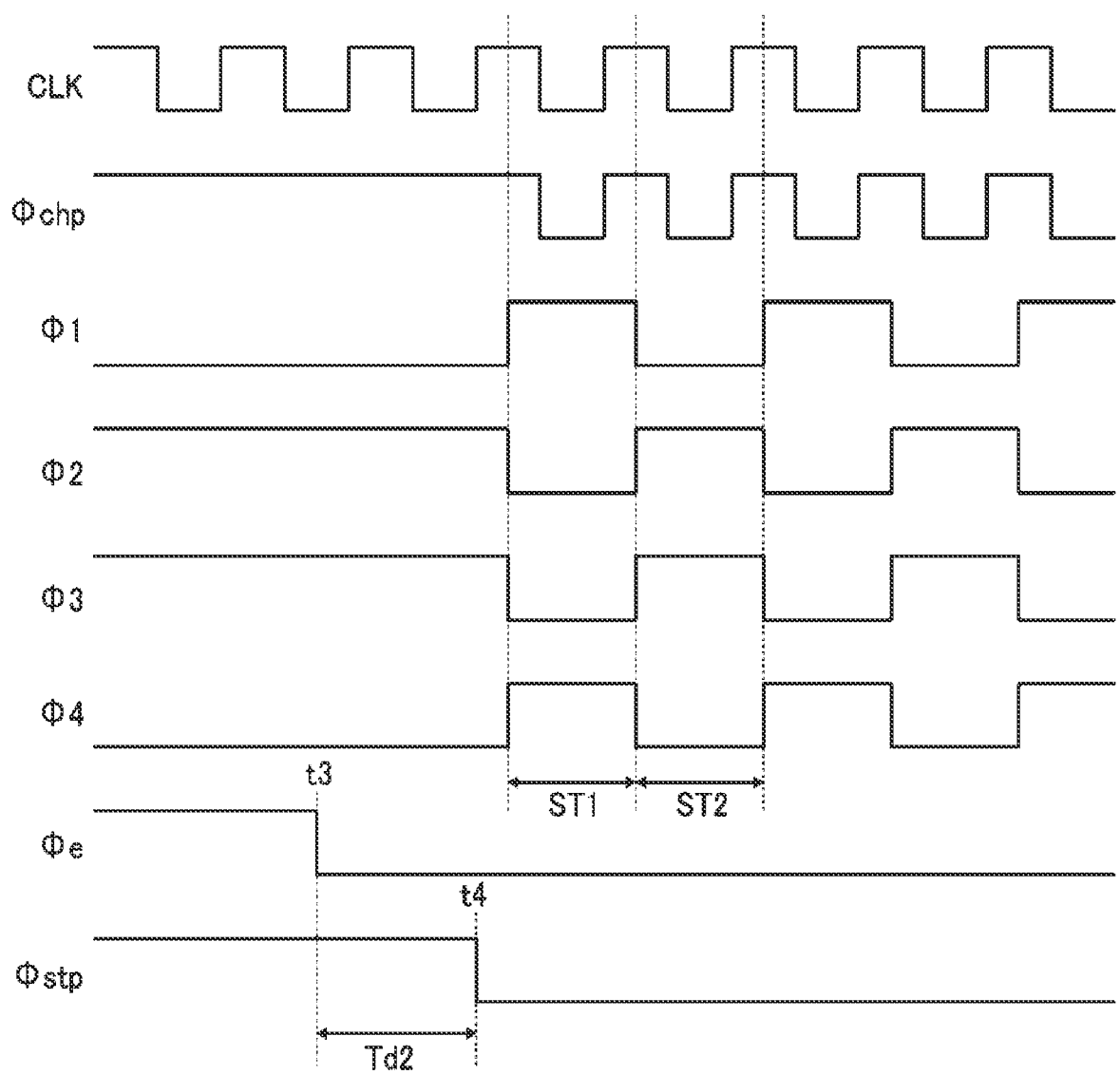
FIG. 5 is a diagram illustrating timings of the respective control signals.

Now, a description will be given of the operation of the amplifier circuitry 1 according to the present embodiment which has the above-described configuration. FIGS. 4 and 5 are diagrams illustrating timings of the respective control signals. FIG. 4 illustrates a case in which the operating state changes from the normal state to the abnormal state, and FIG. 5 illustrates a case in which the operating state changes from the abnormal state to the normal state.

(Operation in Normal State)

When an excessive input voltage Vi is not input, and the input voltage Va of the main amplifying circuit 2 is included in a normal range, the detection signal Φe of the detection circuit 4 reaches the low level. In this case, as illustrated in FIGS. 4 and 5, the phase of the control signals Φ1 and Φ4 becomes opposite to the phase of the control signals Φ2 and Φ3, and a period ST1 of the first switch state and a period ST2 of the second switch state are alternately repeated. As a result, since the sample and hold circuit 30 performs a signal holding operation that is synchronous with the chopper operation of the chopper amplifier circuit 10, ripple that occurs in the chopper amplifier circuit 10 decreases effectively.

Since the negative feedback control works properly in the operation in the normal state, input-offset-voltage correction in the offset correction circuit 3 works effectively. When an input offset voltage of the offset correction circuit 3 is significantly small, and the direct-current gain of the offset correction circuit 3 is sufficiently large, an input offset voltage of the amplifier circuitry 1 decreases considerably compared with the input offset voltage of the main amplifying circuit 2 alone.

When the input offset voltage of the chopper amplifying stage G3 is assumed to be zero, an output residue offset voltage Vofs_r is given by:

$$Vofs\_r = Vos \times A1/(A3 \cdot A4 \cdot A5) \quad (1)$$

where A1 represent a direct-current gain of the amplifying stage G1, A3 represents a direct-current gain of the chopper amplifying stage G3, A4 represents a direct-current gain of the integration amplifying stage G4, A5 represents a direct-current gain of the correction-signal supply circuit G5, and Vos represents an input offset voltage of the amplifying stage G1.

As can be understood from equation (1), in order to reduce the output residue offset voltage Vofs_r, the direct-current gain (A3·A4·A5) of the offset correction circuit 3 needs to be sufficiently increased compared with the direct-current gain A1 of the amplifying stage G1. The offset correction circuit 3 is a system having a larger time constant than that of the main amplifying circuit 2, in order to stably operate the offset correction circuit 3 with a large direct-current gain.

(Operation in Abnormal State: When Offset Correction Circuit 3 is not Controlled)

Next, a case in which no control is performed on the offset correction circuit 3 in the present embodiment will be described as a comparative example of the operation in the abnormal state.

When the output voltage Vo of the main amplifying circuit 2 and the offset correction circuit 3 is saturated owing to an excessive input voltage Vi, the loop of the negative feedback control is not formed, and currents at a saturation level are output from both the amplifying stage G1 and the correction-signal supply circuit G5. In this saturation state, when the input voltage Vi returns to the state of a zero voltage, the saturation state in the main amplifying circuit 2, which operates at relatively high speed, is cleared in response to the input thereto, the output current of the amplifying stage G1 decreases, and the output voltage decreases correspondingly. Meanwhile, since the offset correction circuit 3 has a much larger time constant than the main amplifying circuit 2, as described above, the saturation state of the offset correction circuit 3 is not cleared even when the input voltage Vi returns to the zero voltage, and the excessive current is continuously output from the correction-signal supply circuit G5. Thus, even when the input voltage Vi returns to the zero voltage, a state in which the output voltage Vo does not decrease to the zero voltage continues. Thereafter, when the saturation state of the correction-signal supply circuit G5 begins to be cleared, the output current of the correction-signal supply circuit G5 decreases slowly to an appropriate level, and the output voltage Vo also decreases toward the zero voltage slowly. Thus, when no control on the offset correction circuit 3 is performed in the abnormal state, the time until the operating state returns from the abnormal state increases significantly.

(Operation in Abnormal State: When Only Stopping of Operation of Sample and Hold Circuit 30 is Performed)

Next, a case in which only stopping of the signal holding operation of the sample and hold circuit 30 is performed will be described as a comparative example of the operation in the abnormal state.

Figure 9:
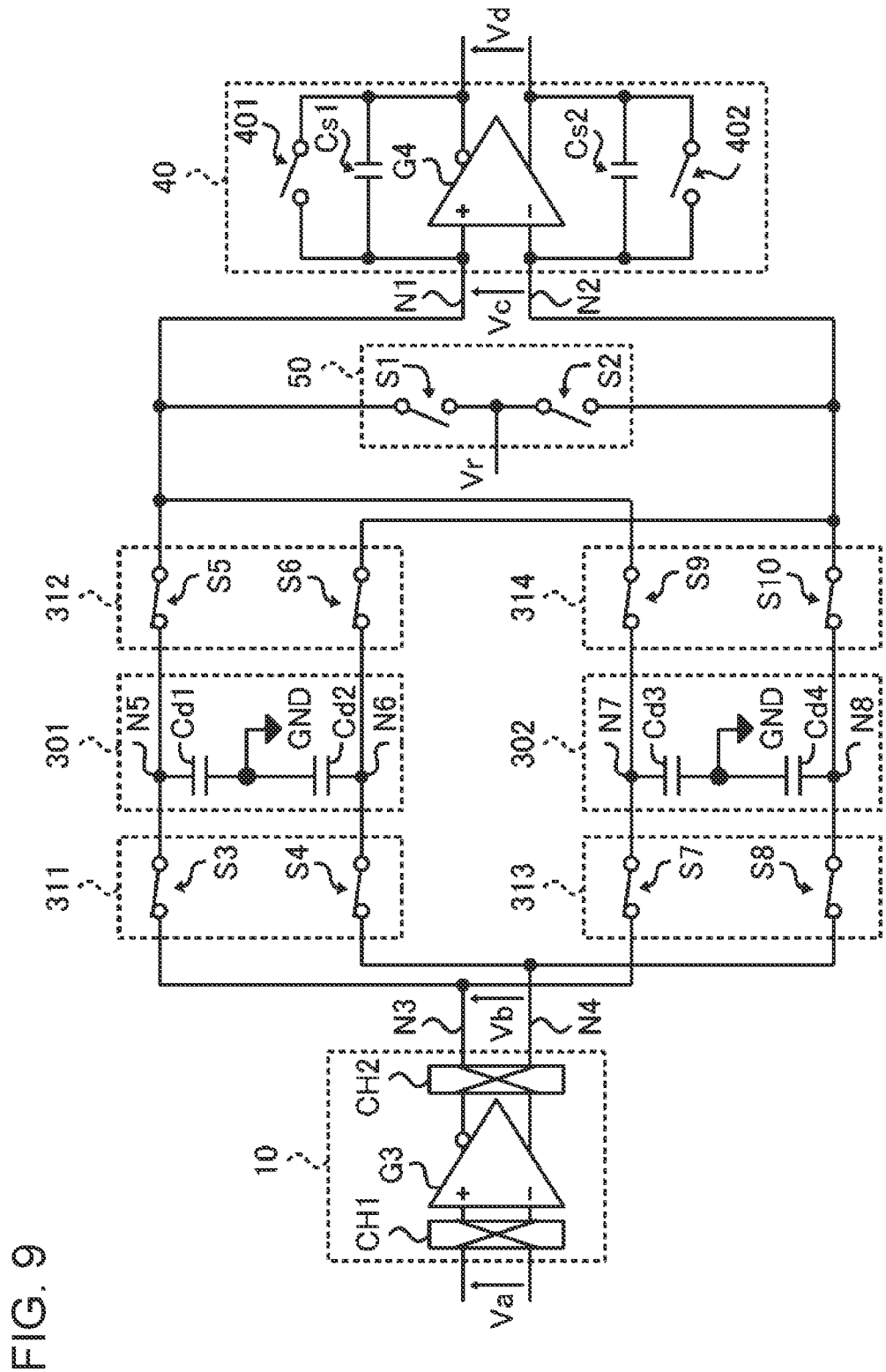
FIG. 9 is a diagram illustrating a comparative example of a control method for an offset correction circuit when the abnormal state is detected.

In this comparative example, control on the integration circuit 40 is not performed, unlike in the present embodiment, and only stopping of the signal holding operation of the sample and hold circuit 30 is performed. That is, only turning on the switches in the first switch circuit 311 to the fourth switch circuit 314 in the sample and hold circuit 30 is performed, as illustrated in FIG. 9.

When the switches in the sample and hold circuit 30 are turned on in the abnormal state so as to cause signals to pass therethrough, a response delay due to the time constants of the sample and hold capacitors Cd1 to Cd4 in the sample and hold circuit 30 is eliminated. As a result, the response speed of the offset correction circuit 3 increases correspondingly, and the recovery from the saturation state is also sped up, so that the time until returning from the abnormal state decreases. However, this scheme cannot increase the response speed of the integration circuit 40 which limits the band of the offset correction circuit 3, and thus the time reduction effect is limited. Also, when the electrostatic capacitances of the integration capacitors Cs1 and Cs2 in the integration circuit 40 are increased in order to enhance the stability of the offset correction circuit 3, the time until the saturation state is cleared in the offset correction circuit 3 becomes relatively long. In this case, there is a problem that the advantage of time reduction due to turning on of the switches in the sample and hold circuit 30 further decreases. (Operation in Abnormal State: When Control in the Present Embodiment is Performed)

Next, a description will be given of a case in which the offset correction circuit 3 is controlled in the abnormal state by using a method in the present embodiment.

When the detection circuit 4 detects the abnormal state, the detection signal Φe rises from the low level to the high level (time point t1), a delay time Td1 of the delay circuit 51 from the rising elapses, and then the control signal Φstp rises from the low level to the high level (time point t2), as illustrated in FIG. 4. As a result, the switches in the sample and hold circuit 30, the integration circuit 40, and the common-mode switch circuit 50 in the offset correction circuit 3 are put into states as illustrated in FIG. 6.

Figure 6:
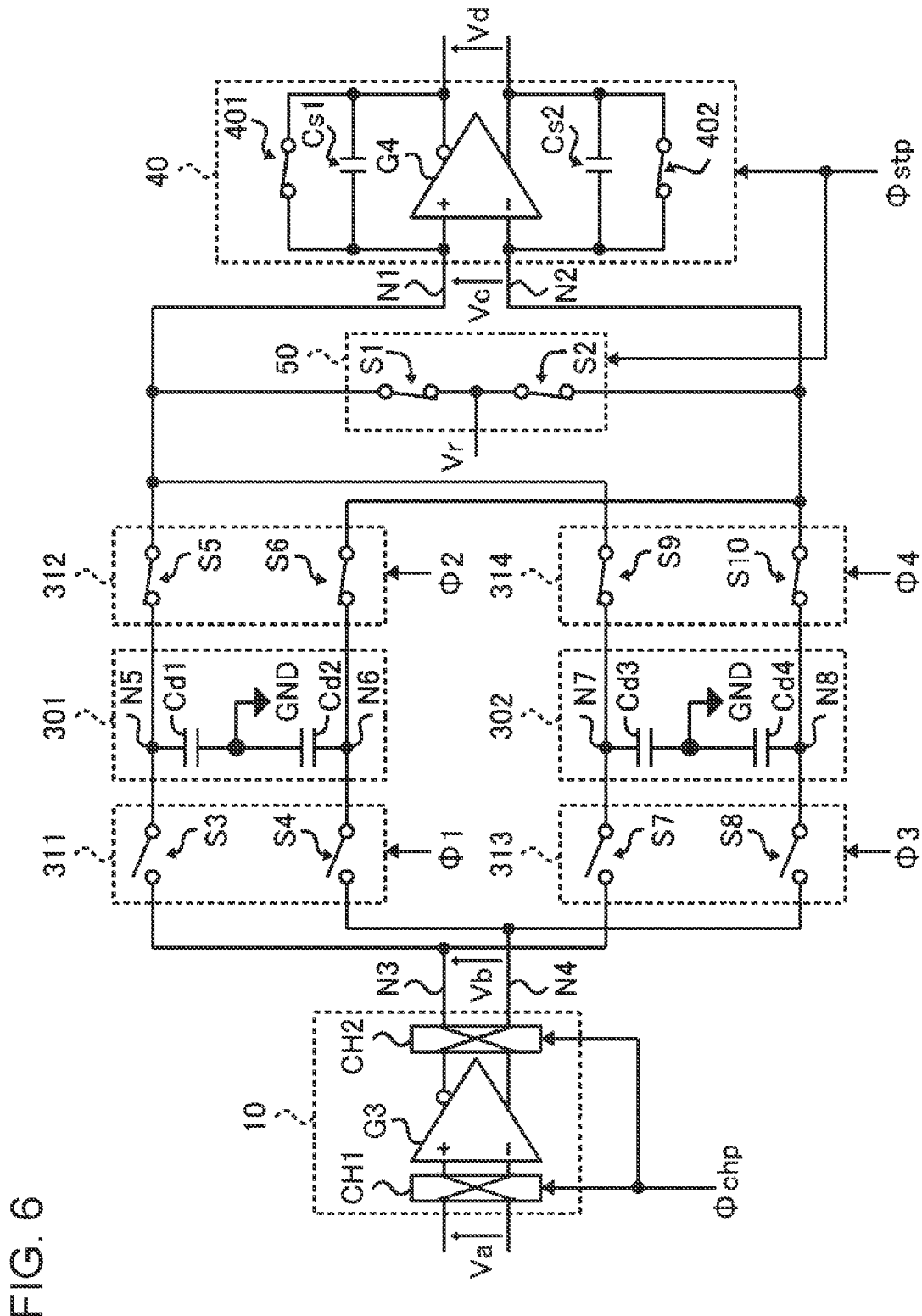
FIG. 6 is a diagram illustrating states of switches when an abnormal state is detected.

As illustrated in FIG. 6, in the integration circuit 40, the discharging circuits 401 and 402 discharge the charges in the integration capacitors Cs1 and Cs2, respectively. As a result, the charges in the integration capacitors Cs1 and Cs2, the charges being in the state of the integration of the signals of the integration circuit 40, are put into a default state in which the charges are generally zero. When the detection circuit 4 detects that the operating state returns to the normal state, and the discharging in the discharging circuits 401 and 402 is stopped, the integration circuit 40 starts the integration of signals from the default state in which the charges in the integration capacitors Cs1 and Cs2 are zero. Thus, compared with a case in which the integration is resumed from a state in which the saturated charges are accumulated in the integration capacitors Cs1 and Cs2, the time until returning from the abnormal state decreases considerably.

Also, the input nodes N1 and N2 of the integration circuit 40 are connected to the common mode reference voltage Vr via the common-mode switch circuit 50, as illustrated in FIG. 6. As a result, when the detection circuit 4 detects that the operating state returns to the normal state, and the common-mode switch circuit 50 is turned off, the integration circuit 40 resumes the integration of signals in a state in which the voltages of the input nodes N1 and N2 are close to the common mode reference voltage Vr. Thus, compared with a case in which the integration of signals is started in a state in which the voltages of the input nodes N1 and N2 are offset from the common mode reference voltage Vr owing to influences of the saturation state, the time until returning from the abnormal state decreases.

Also, when the detection circuit 4 detects the abnormal state, the common mode reference voltage Vr is applied to the sample and hold capacitors Cd1 to Cd4 in the sample and hold circuit 30, as illustrated in FIG. 6. Thus, compared with a case in which the signal holding operation of the sample and hold circuit 30 is resumed in a state in which the sample and hold capacitors Cd1 to Cd4 have voltages that are offset from the common mode reference voltage Vr, the time until the operating state returns from the abnormal state decreases.

Also, since the signal paths between the chopper amplifier circuit 10 and the sample and hold capacitors Cd1 to Cd4 are disconnected in the sample and hold circuit 30, as illustrated in FIG. 6, unwanted load current does not flow to the output of the chopper amplifier circuit 10.

In addition, when the detection circuit 4 detects the abnormal state, the chopper operation of the chopper amplifier circuit 10 is stopped. As a result, in the chopper amplifier circuit 10 put into the saturation state in the abnormal state, noise due to the chopper operation does not occur.

When the detection circuit 4 detects that the operating state returns from the abnormal state to the normal state, the detection signal Φe falls from the high level to the low level (time point t3), a delay time Td2 of the delay circuit 51 from the falling elapses, and then the control signal Φstp falls from the high level to the low level (time point t4), as illustrated in FIG. 5. When the control signal Φstp reaches the low level, the offset correction circuit 3 resumes the above-described operation in the normal state. The provision of a delay time as described above makes it possible to put the operating state into generally the normal state at a point in time when the delay time elapses, even when the timing at which the detection circuit detection 4 detects a change from the abnormal state to the normal state is slightly early.

This makes it difficult for the operation in the normal state to be started in the abnormal state.

Figure 7A:
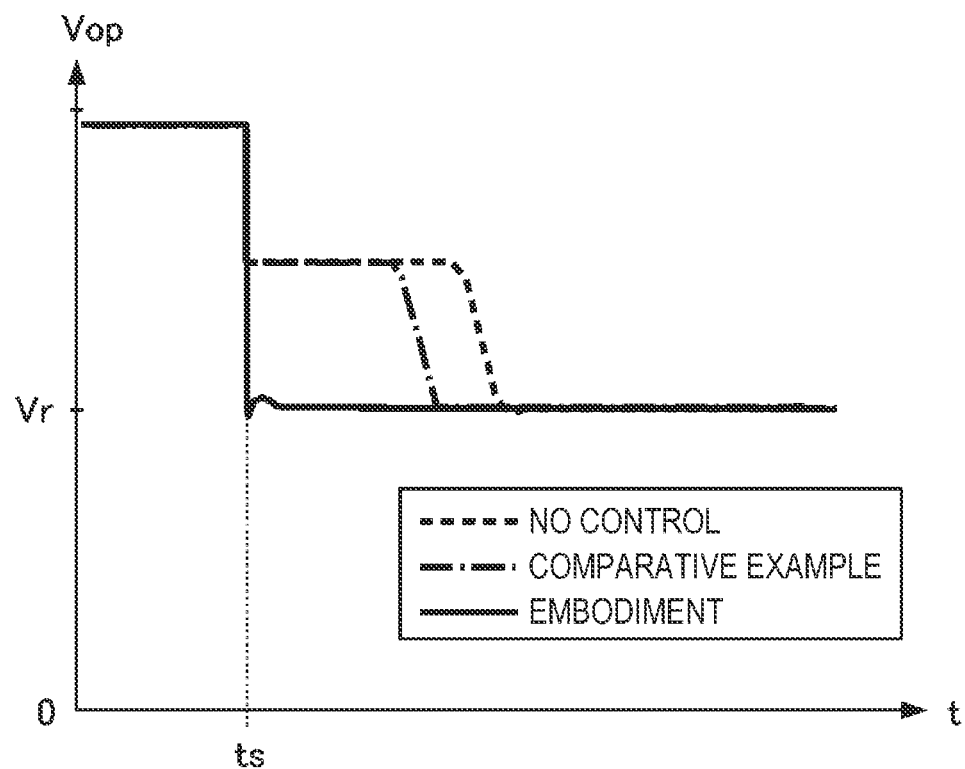
FIGS. 7A and 7B are graphs illustrating one example of output waveforms during when an operating state returns from the abnormal state to a normal state.
Figure 7B:
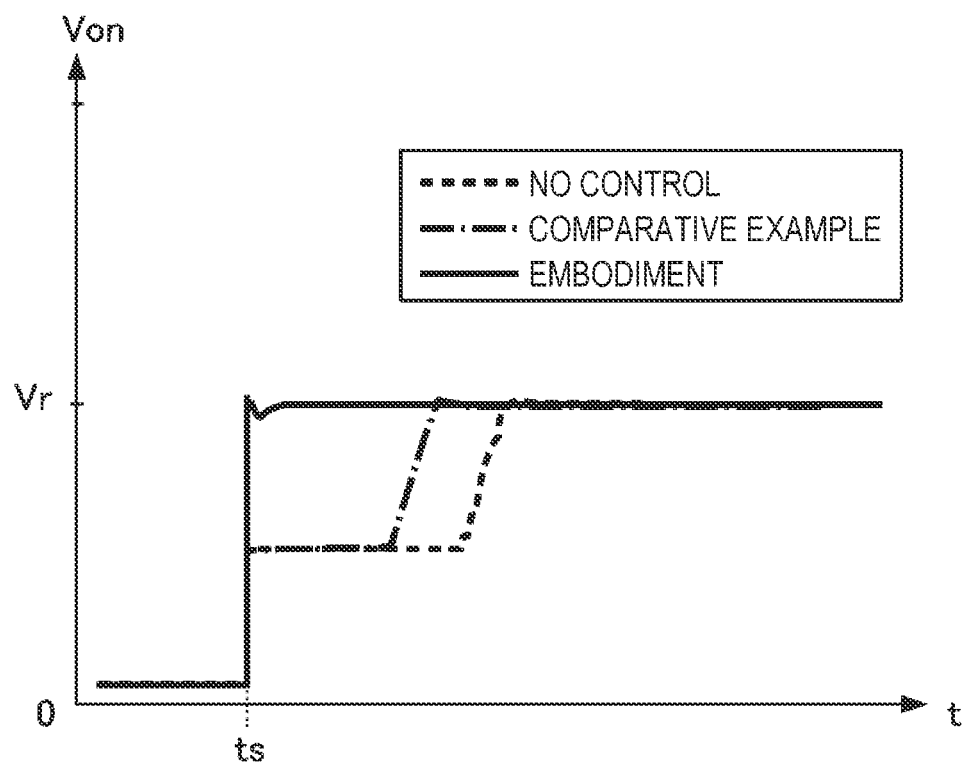

FIGS. 7A and 7B are graphs illustrating one example of output waveforms when the operating state returns from the abnormal state to the normal state. FIG. 7A illustrates waveforms of the positive-side voltage Vop of the output voltage Vo, and FIG. 7B illustrates waveforms of the negative-side voltage Von of the output voltage Vo. In each of FIGS. 7A and 7B, the dotted line represents a waveform in the above-described case in which no control is performed on the offset correction circuit 3, the dashed-dotted line represents a waveform in the above-described case in which only stopping of the operation of the sample and hold circuit 30 is performed, and the solid line represents a waveform in a case in which the control in the present embodiment is performed on the offset correction circuit 3. Time point is represents a time point at which an excessive input voltage Vin is set to the zero voltage. As can be understood from comparison of those waveforms, performing the control in the present embodiment makes it possible to considerably reduce the time until returning from the abnormal state due to the excessive input voltage Vin.

According to the amplifier circuitry 1 in the present embodiment, when the abnormal state in which the level of signals input to the main amplifying circuit 2 exceeds the normal range is detected, the state of the integration of signals in the integration circuit 40 is set to the default state (the state in which charges in the integration capacitors Cs1 and Cs2 are discharged), as described above. Thereafter, when it is detected that the operating state returns to the normal state in which the level of signals input to the main amplifying circuit 2 is included in the normal range, the setting of the default state (i.e., the discharging of the integration capacitors Cs1 and Cs2) in the integration circuit 40 is canceled. At this point in time, the integration of the signals in the integration circuit 40 is resumed from the default state, to thereby facilitate that the integration circuit 40 starts the integration operation in a state close to a case in which the negative feedback control is working properly. This facilitates that the correction signals output from the correction-signal supply circuit G5 in response to the output signals of the filter circuit 20 return to an appropriate level quickly, thus facilitating that the negative feedback control returns to the normal state quickly.

In the amplifier circuitry 1 according to the present embodiment, when the state of the integration of signals in the integration circuit 40 is set to the default state, the signal holding that is performed by the sample and hold circuit 30 and that is synchronous with the chopper operation is stopped, and the levels of signals held in the sample and hold capacitors Cd1 to Cd4 are set to the default level (the common mode reference voltage Vr). Thereafter, when the setting of the default state in the integration circuit 40 (the discharging of the integration capacitors Cs1 and Cs2) is canceled, the setting of the default level in the sample and hold capacitors Cd1 to Cd4 (i.e., the application of the common mode reference voltage Vr) is canceled, and the signal holding that is performed by the sample and hold circuit 30 and that is synchronous with the chopper operation is resumed. At this point in time, the operation of the sample and hold circuit 30 is resumed from the state in which the levels of the signals held in the sample and hold capacitors Cd1 to Cd4 are the default level (the common mode reference voltage Vr), thus facilitating that the sample and hold circuit 30 starts the signal holding operation in a state close to a case in which the negative feedback control is working properly. This facilitates that the correction signals output from the correction-signal supply circuit G5 in response to the output signals of the filter circuit 20 return to an appropriate level quickly and thus facilitates that the negative feedback control returns to the normal state quickly.

Next, a second embodiment of the present invention will be described.

The present embodiment relates to a magnetic-balance current sensor using an output circuit according to the present invention.

Figure 8:
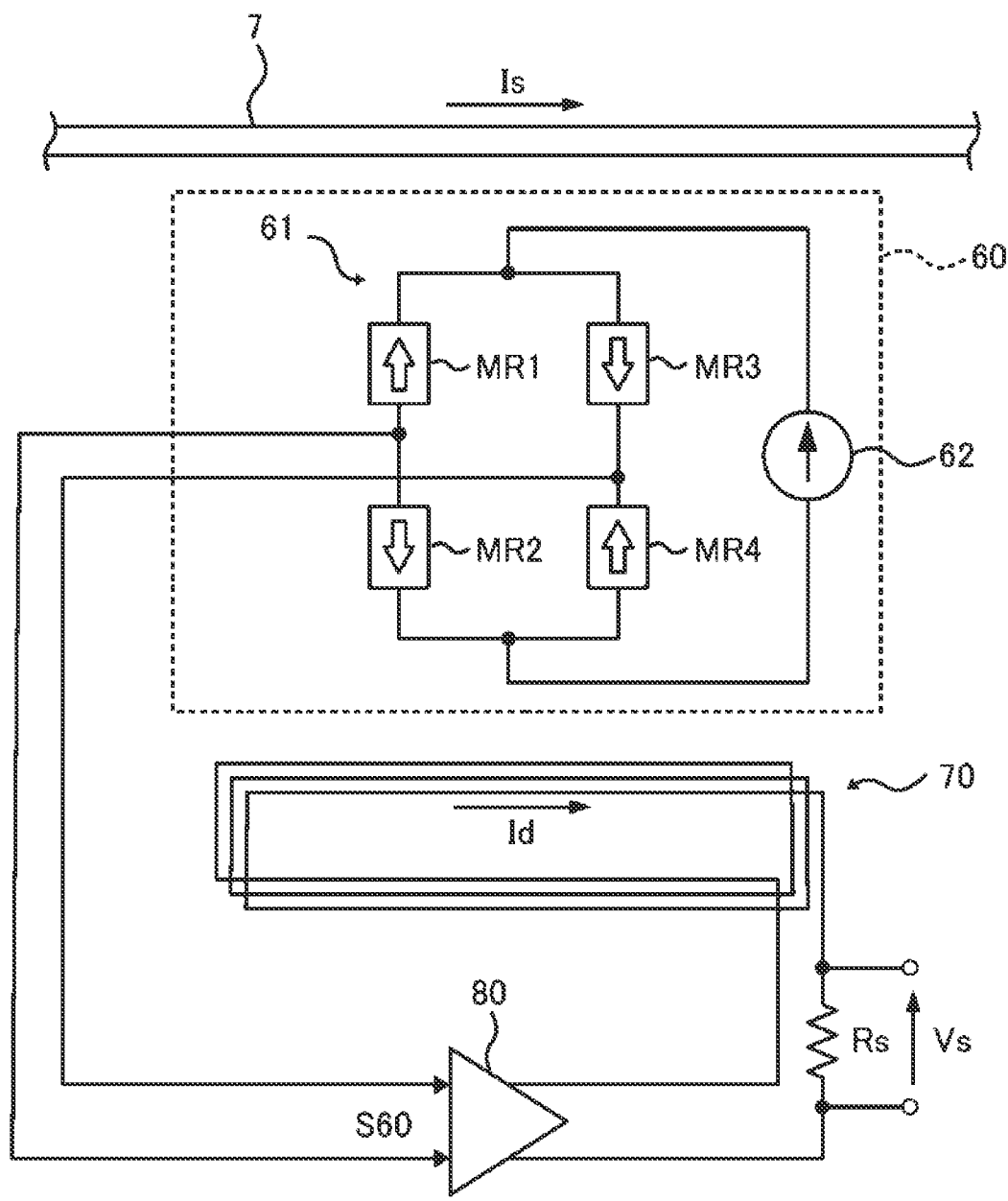
FIG. 8 is a diagram illustrating one example of a configuration of a current sensor according to a second embodiment of the present invention.

FIG. 8 is a diagram illustrating one example of a configuration of a current sensor according to the second embodiment. The current sensor illustrated in FIG. 8 includes a magnetic sensor 60 that outputs a detection signal S60 corresponding to a magnetic field due to a measurement current Is that flows in a conductor 7, a coil 70 that generates a magnetic field in a direction in which a magnetic field due to the measurement current Is, the magnetic field affecting the magnetic sensor 60, is canceled out, and a coil drive circuit 80.

In the example in FIG. 8, the magnetic sensor 60 includes four magnetoresistive elements MR1 to MR4 that constitute a bridge circuit 61 and a constant current source 62 that supplies constant current to the bridge circuit 61. When the magnetic field due to the measurement current Is and the magnetic field due to the current Id that flows in the coil 70 are in equilibrium, the detection signal S60 reaches a predetermined reference level. When the two magnetic fields are not in equilibrium, the detection signal S60 becomes larger than or smaller than a reference level in accordance with the magnitude of the two magnetic fields.

In response to the detection signal S60 output from the magnetic sensor 60, the coil drive circuit 80 drives the coil 70 so that the magnetic field due to the measurement current Is, the magnetic field affecting the magnetic sensor 60, and the magnetic field due to the current Id that flows in the coil 70 become equilibrium. That is, the coil drive circuit 80 performs negative feedback control on the current Id in the coil 70 so that the level of the detection signal S60 becomes equal to the aforementioned reference level.

The current Id in the coil 70 is generally proportional to the measurement current Is and indicates a measurement result of the measurement current Is. The current Id is output, for example, as a voltage Vs that occurs in a shunt resistor Rs provided for the coil 70, as illustrated in FIG. 8.

The coil drive circuit 80 has the amplifier circuitry 1 according to the above-described embodiments of the present invention in order to amplify the detection signal S60 output from the magnetic sensor 60. Thus, the measurement current Is, ranging from a direct current to a higher frequency, that flows in the conductor 7 can be measured with high accuracy. Even if the measurement value reaches its maximum value owing to an excessive measurement current Is, when the measurement current Is decreases to a measurable level, the measurement value follows the measurement current Is quickly, thus making it possible to obtain an accurate measurement value.

Although some embodiments of the present invention have been described above, the present invention is not limited to the above-described embodiments and includes various variations. That is, each circuit configuration described in the above embodiments is exemplary and can be replaced with another circuit that realizes substantially the same functions.

Although, in the above-described embodiments, the sample and hold circuit 30 is provided on the signal path between the chopper amplifier circuit 10 and the integration circuit 40, a sample and hold circuit may be provided on a signal path between an integration circuit and a correction-signal supply circuit in another embodiment of the present invention.

Although, in the above-described embodiments, the detection circuit 4 detects the abnormal state based on the output voltage Vo, the present invention is not limited thereto. In another embodiment of the present invention, the abnormal state may be detected based on the input signals (the voltage Va) of the main amplifying circuit 2, output signals (a voltage Vb) of the chopper amplifier circuit 10, or the like. The abnormal state may also be detected based on not only one signal but also a plurality of signals.

Although, in the above-described embodiments, the common-mode switch circuit 50 connects the input nodes N1 and N2 of the integration circuit 40 to the common mode reference voltage Vr, the input nodes N1 and N2 of the integration circuit 40 may be short-circuited in another embodiment of the present invention.

Although, in the above-described embodiments, the sample and hold capacitors Cd1 to Cd4 in the sample and hold circuit 30 and the input of the stage (the chopper amplifier circuit 10) previous to the sample and hold circuit 30 are disconnected from each other when the abnormal state is detected, the present invention is not limited to this example. When the saturation state occurs due to an excessive input, the negative feedback control is not established. Thus, instead of disconnecting the above-described signal path in the sample and hold circuit 30, for example, the previous stage and the subsequent stage of the sample and hold circuit 30 may be directly connected using switches, as illustrated in FIG. 9.

What is claimed is:

1. Amplifier circuitry comprising:
   a main amplifying circuit in which an output is negatively fed back to an input;
   an offset correction circuit that corrects an input offset voltage of the main amplifying circuit;
   a detection circuit that detects an abnormal state in which a level of signals input to the main amplifying circuit exceeds a normal range; and
   a control circuit that controls the offset correction circuit,
   wherein in the main amplifying circuit, the input offset voltage is corrected in accordance with correction signals supplied from the offset correction circuit;
   wherein the offset correction circuit includes:
      a chopper amplifier circuit that amplifies an input voltage of the main amplifying circuit,
      a filter circuit that removes a high-frequency component included in output signals of the chopper amplifier circuit, and
      a correction-signal supply circuit that supplies the correction signals corresponding to output signals of the filter circuit to the main amplifying circuit;
   wherein the filter circuit includes an integration circuit provided on a signal path between the chopper amplifier circuit and the correction-signal supply circuit; and
   wherein the control circuit:
      sets a state of integration of signals in the integration circuit to a default state, when the detection circuit detects the abnormal state, and
      cancels the setting of the default state in the integration circuit, when the detection circuit detects the abnormal state and then detects that an operating state returns to a normal state in which the level of signals input to the main amplifying circuit is included in the normal range.

2. The amplifier circuitry according to claim 1,
   wherein, when the detection circuit detects the abnormal state and then detects that the operating state returns to the normal state, the control circuit cancels the setting of the default state in the integration circuit after a delay time elapses from when the detection circuit detects that the operating state returns to the normal state.

3. The amplifier circuitry according to claim 1,
   wherein the integration circuit includes:
      an integration amplifying stage provided on a signal path between the chopper amplifier circuit and the correction-signal supply circuit,
      at least one integration capacitor provided on at least one negative feedback path between an input and an output of the integration amplifying stage, and
      a discharging circuit that discharges charge accumulated in the integration capacitor, and
   wherein, when the state of the integration of the signals in the integration circuit is set to the default state, the control circuit causes the discharging circuit to discharge the charge accumulated in the integration capacitor.

4. The amplifier circuitry according to claim 1,
   wherein the filter circuit includes a sample and hold circuit provided on a signal path between the chopper amplifier circuit and the integration circuit or on a signal path between the integration circuit and the correction-signal supply circuit;
   wherein in synchronization with a chopper operation of the chopper amplifier circuit, the sample and hold circuit holds signals, output from a previous stage, in one or more sample and hold capacitors and outputs the held signals to a subsequent stage,
   when the state of the integration of the signals in the integration circuit is set to the default state, the control circuit stops the signal holding that is performed by the sample and hold circuit and that is synchronous with the chopper operation, and sets a level of the signals held in the one or more sample and hold capacitors to a default level, and
   when the setting of the default state in the integration circuit is canceled, the control circuit cancels the setting of the default level in the one or more sample and hold capacitors and resumes the signal holding that is performed by the sample and hold circuit and that is synchronous with the chopper operation.

5. The amplifier circuitry according to claim 4,
   wherein, when the state of the integration of the signals in the integration circuit is set to the default state, the control circuit controls the sample and hold circuit so as to disconnect a path through which signals are input to the one or more sample and hold capacitors from the previous stage of the sample and hold circuit.

6. The amplifier circuitry according to claim 4,
   wherein the filter circuit has a common-mode switch circuit provided on a path that connects a pair of input nodes of the integration circuit and a common mode reference voltage; and
   the control circuit turns on the common-mode switch circuit when the state of the integration of the signals in the integration circuit is set to the default state and turns off the common-mode switch circuit when the setting of the default state in the integration circuit is canceled.

7. The amplifier circuitry according to claim 6,
   wherein the sample and hold circuit includes:
      a first capacitor circuit and a second capacitor circuit, each including two sample and hold capacitors included in the one or more sample and hold capacitors and connected in series between a pair of nodes,
a first switch circuit provided on a path that connects the pair of nodes in the first capacitor circuit and a pair of output nodes of the chopper amplifier circuit,
a second switch circuit provided on a path that connects the pair of nodes in the first capacitor circuit and the pair of input nodes of the integration circuit,
a third switch circuit provided on a path that connects the pair of nodes in the second capacitor circuit and the pair of output nodes of the chopper amplifier circuit, and
a fourth switch circuit provided on a path that connects the pair of nodes in the second capacitor circuit and the pair of input nodes in the integration circuit;
wherein in each of the first capacitor circuit and the second capacitor circuit, an intermediate connection node of the two sample and hold capacitors connected in series is connected to a reference potential; and
wherein the control circuit:
alternately switches between a first switch state and a second switch state every cycle of the chopper operation, when the sample and hold circuit performs the signal holding that is synchronous with the chopper operation, wherein in the first switch state, the first switch circuit and the fourth switch circuit are turned on, and the second switch circuit and the third switch circuit are turned off, and in the second switch state, the first switch circuit and the fourth switch circuit are turned off, and the second switch circuit and the third switch circuit are turned on, and
turns off each of the first switch circuit and the third switch circuit and turns on each of the second switch circuit and the fourth switch circuit, when the state of the integration of the signals in the integration circuit is set to the default state.

8. The amplifier circuitry according to claim 1,
wherein the control circuit:
stops the chopper operation of the chopper amplifier circuit when the state of the integration of the signals in the integration circuit is set to the default state, and
resumes the chopper operation of the chopper amplifier circuit when the setting of the default state in the integration circuit is canceled.

9. The amplifier circuitry according to claim 1,
wherein the detection circuit detects the abnormal state, based on at least one of an output signal of the main amplifying circuit, an input signal of the main amplifying circuit, and an output signal of the chopper amplifier circuit.

10. The amplifier circuitry according to claim 1,
wherein the main amplifying circuit includes a plurality of amplifying stages connected in cascade; and
the correction-signal supply circuit supplies the correction signals to an intermediate node via which the amplifying stages are connected in cascade.

11. A current sensor comprising:
a magnetic sensor that outputs a detection signal corresponding to a magnetic field due to measurement current;
a coil that generates a magnetic field in a direction in which the magnetic field due to the measurement current, the magnetic field affecting the magnetic sensor, is canceled out;
a coil drive circuit that drives the coil in response to the detection signal so that the magnetic field due to the measurement current, the magnetic field affecting the magnetic sensor, and a magnetic field due to current that flows in the coil become equilibrium; and
amplifier circuitry comprising:
a main amplifying circuit in which an output is negatively fed back to an input;
an offset correction circuit that corrects an input offset voltage of the main amplifying circuit;
a detection circuit that detects an abnormal state in which a level of signals input to the main amplifying circuit exceeds a normal range; and
a control circuit that controls the offset correction circuit,
wherein in the main amplifying circuit, the input offset voltage is corrected in accordance with correction signals supplied from the offset correction circuit;
wherein the offset correction circuit includes:
a chopper amplifier circuit that amplifies an input voltage of the main amplifying circuit,
a filter circuit that removes a high-frequency component included in output signals of the chopper amplifier circuit, and
a correction-signal supply circuit that supplies the correction signals corresponding to output signals of the filter circuit to the main amplifying circuit;
wherein the filter circuit includes an integration circuit provided on a signal path between the chopper amplifier circuit and the correction-signal supply circuit; and
wherein the control circuit:
sets a state of integration of signals in the integration circuit to a default state, when the detection circuit detects the abnormal state, and
cancels the setting of the default state in the integration circuit, when the detection circuit detects the abnormal state and then detects that an operating state returns to a normal state in which the level of signals input to the main amplifying circuit is included in the normal range.

\* \* \* \* \*